(12) United States Patent
Pawlak

(10) Patent No.: US 9,741,847 B2
(45) Date of Patent: Aug. 22, 2017

(54) METHODS OF FORMING A CONTACT STRUCTURE FOR A VERTICAL CHANNEL SEMICONDUCTOR DEVICE AND THE RESULTING DEVICE

(71) Applicant: GLOBALFOUNDRIES Inc., Grand Cayman (KY)

(72) Inventor: Bartlomiej Jan Pawlak, Leuven (BE)

(73) Assignee: GLOBALFOUNDRIES Inc., Grand Cayman (KY)

( * ) Notice: Subject to any disclaimer, the term of this patent is extended or adjusted under 35 U.S.C. 154(b) by 0 days.

(21) Appl. No.: 14/953,874

(22) Filed: Nov. 30, 2015

(65) Prior Publication Data
US 2017/0154994 A1   Jun. 1, 2017

(51) Int. Cl.
| | |
|---|---|
| H01L 21/336 | (2006.01) |
| H01L 29/78 | (2006.01) |
| H01L 29/66 | (2006.01) |
| H01L 29/06 | (2006.01) |
| H01L 21/761 | (2006.01) |
| H01L 29/45 | (2006.01) |
| H01L 29/417 | (2006.01) |
| H01L 29/423 | (2006.01) |
| H01L 21/265 | (2006.01) |

(52) U.S. Cl.
CPC .... *H01L 29/7827* (2013.01); *H01L 21/26506* (2013.01); *H01L 21/26513* (2013.01); *H01L 21/761* (2013.01); *H01L 29/0646* (2013.01); *H01L 29/41741* (2013.01); *H01L 29/41766* (2013.01); *H01L 29/42356* (2013.01); *H01L 29/45* (2013.01); *H01L 29/66666* (2013.01)

(58) Field of Classification Search
None
See application file for complete search history.

(56) References Cited

U.S. PATENT DOCUMENTS

| | | | | |
|---|---|---|---|---|
| 2011/0068418 | A1* | 3/2011 | Lung | B82Y 10/00 257/413 |
| 2015/0333152 | A1* | 11/2015 | Lin | H01L 29/78 257/329 |

\* cited by examiner

*Primary Examiner* — Cory Eskridge
(74) *Attorney, Agent, or Firm* — Amerson Law Firm, PLLC

(57) ABSTRACT

One illustrative method disclosed includes, among other things, forming a vertically oriented semiconductor structure above a doped well region defined in a semiconductor substrate, the semiconductor structure comprising a lower source/drain region and an upper source/drain region, wherein the lower source/drain region physically contacts the upper surface of the substrate, forming a counter-doped isolation region in the substrate, forming a metal silicide region in the substrate above the counter-doped isolation region, wherein the metal silicide region is in physical contact with the lower source/drain region, and forming a lower source/drain contact structure that is conductively coupled to the metal silicide region.

23 Claims, 14 Drawing Sheets

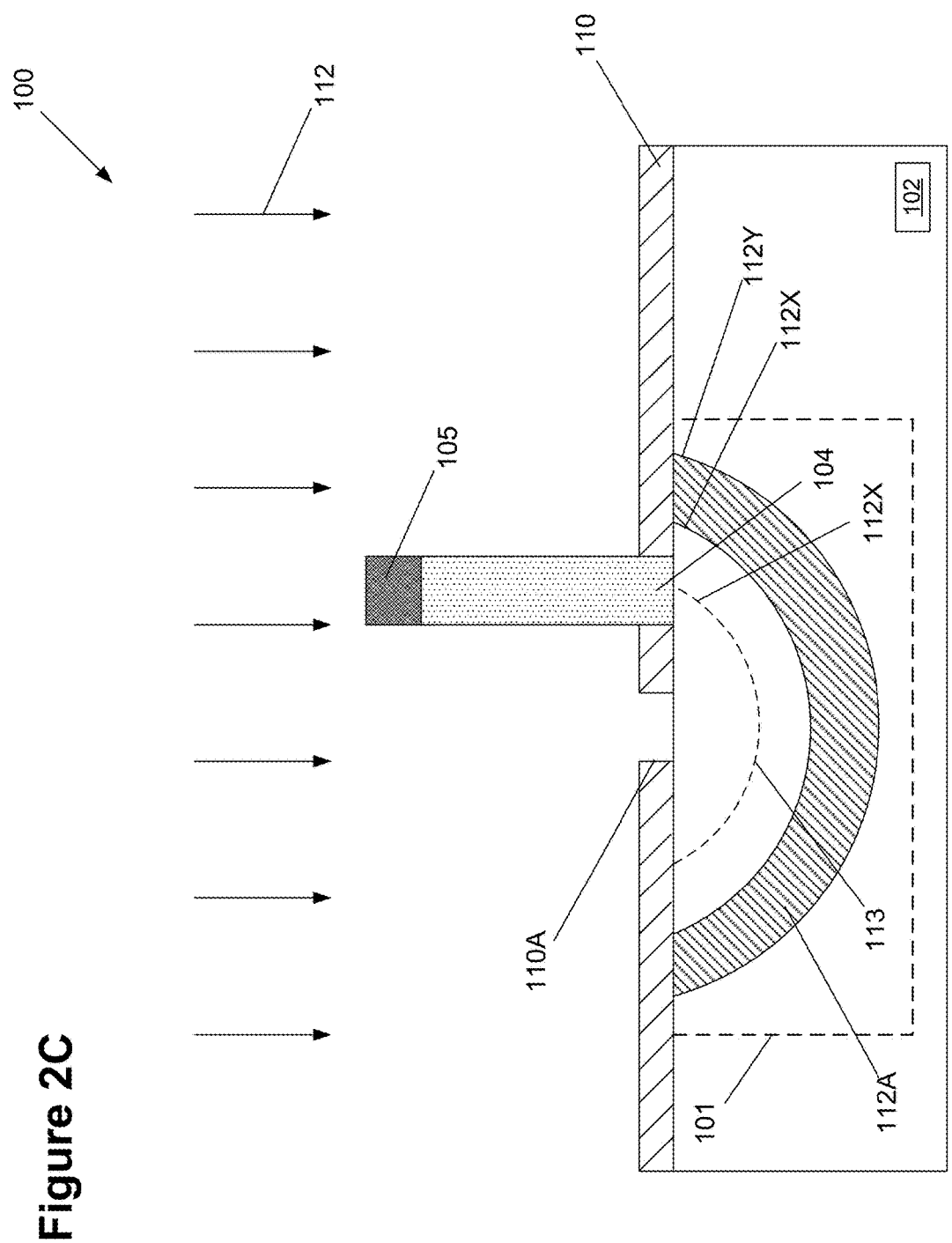

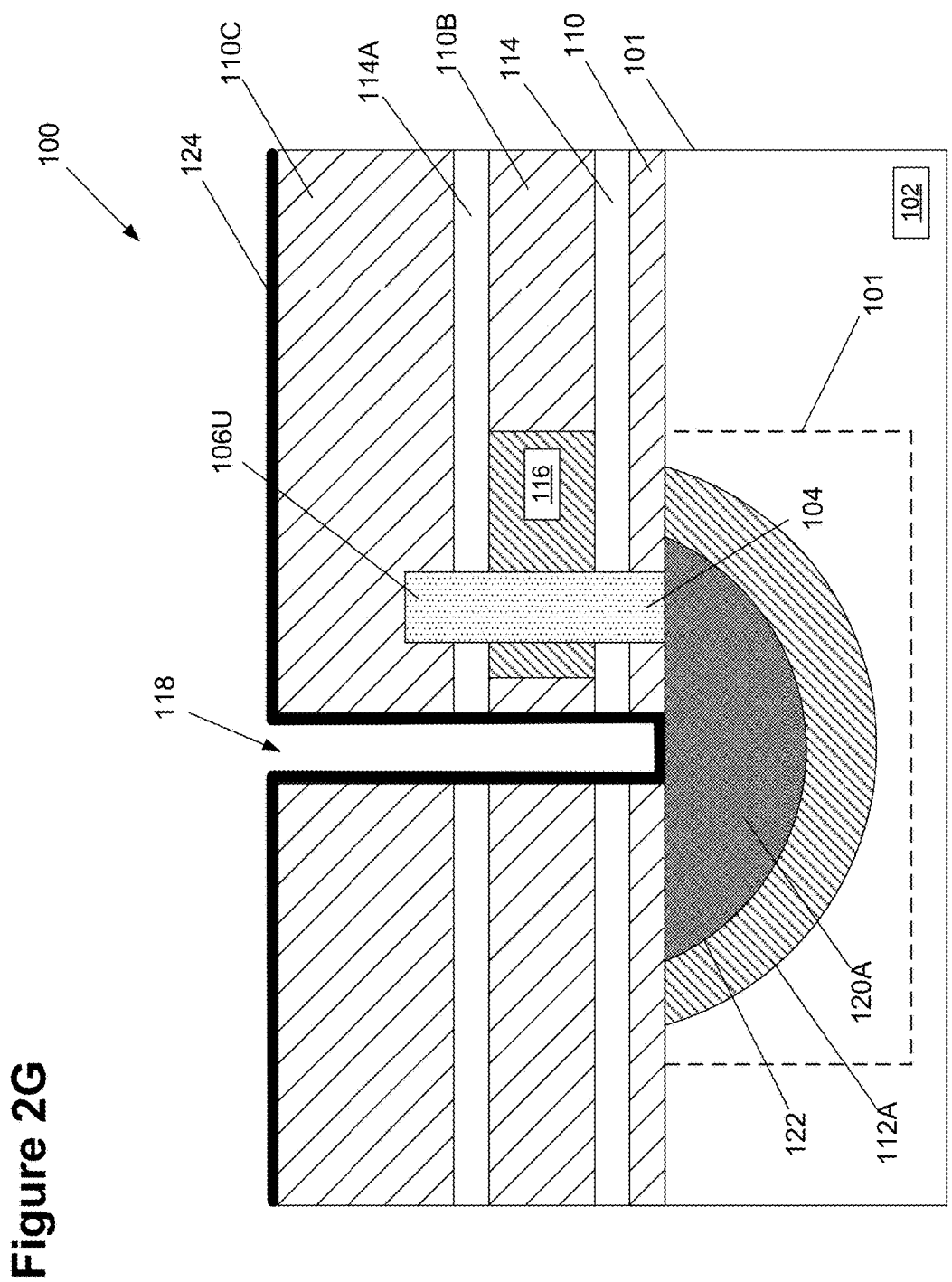

METHODS OF FORMING A CONTACT STRUCTURE FOR A VERTICAL CHANNEL SEMICONDUCTOR DEVICE AND THE RESULTING DEVICE

BACKGROUND OF THE INVENTION

1. Field of the Invention

The present disclosure generally relates to the fabrication of integrated circuits, and, more particularly, to various methods of forming a contact structure for a vertical channel semiconductor device and the resulting device.

2. Description of the Related Art

In modern integrated circuits, such as microprocessors, storage devices and the like, a very large number of circuit elements, especially field effect transistors (FETs), are provided and operated on a restricted chip area. FETs come in a variety of different configurations, e.g., planar devices, FinFET devices, omega gate devices, gate-all-around (GAO) devices, such as nanowire devices, etc. These FET devices are typically operated in a switched mode, that is, these devices exhibit a highly conductive state (on-state) and a high impedance state (off-state). The state of the field effect transistor is controlled by a gate electrode, which controls, upon application of an appropriate control voltage, the conductivity of a channel region formed between a drain region and a source region.

The channel structure of these various FET devices may be oriented substantially horizontal or substantially vertical relative to a reference planar upper surface of a semiconductor substrate. In FETs with a horizontally oriented channel structure, the current passing through the channel region of the device (when the device is "ON") travels in a direction that is substantially parallel to the reference planar upper surface of the semiconductor substrate. In contrast, in FETs with a vertically oriented channel structure, the current passing through the channel region of the device (when the device is "ON") travels in a direction that is substantially perpendicular to the reference planar upper surface of the semiconductor substrate.

FIG. 1 is a simplistic depiction of a prior art vertical channel device (a nanowire device) 10 with a gate-all-around gate structure. The device 10 is formed above a semiconductor substrate 12. The device 10 includes a vertical nanowire semiconductor structure 14, a gate structure 18, a plurality of layers of insulating material 16, 20, 20A and an upper conductive structure 22. The vertical nanowire semiconductor structure 14 is comprised of a lower source/drain region 15L, an upper source/drain region 15U and a channel region 17. The device 10 also includes an illustrative contact structure 26 for establishing electrical connection to the upper source/drain region 15U (via the conductive structure 22), an illustrative contact structure 28 for establishing electrical connection to the gate structure 18, and an illustrative contact structure 30 for establishing electrical connection to the lower source/drain region 15L (via the substrate 12). The contact structures 26, 28 and 30 may not all be positioned within the same plane as depicted in FIG. 1. Establishing electrical contact to the lower source/drain region 15L via the substrate 12 is problematic due to, among other things, the relatively long distance 32 that is typically found in some devices between the contact area and the lower source/drain region 15L. Moreover, the substrate 12 itself defines a relatively high resistance path for the flow of current from the contact 30 to the lower source/drain region 15L, thereby reducing device performance.

The present disclosure is directed to various methods of forming a contact structure for a vertical channel semiconductor device and the resulting device that may avoid, or at least reduce, the effects of one or more of the problems identified above.

SUMMARY OF THE INVENTION

The following presents a simplified summary of the invention in order to provide a basic understanding of some aspects of the invention. This summary is not an exhaustive overview of the invention. It is not intended to identify key or critical elements of the invention or to delineate the scope of the invention. Its sole purpose is to present some concepts in a simplified form as a prelude to the more detailed description that is discussed later.

Generally, the present disclosure is directed to various novel methods of forming a contact structure for a vertical channel semiconductor device and the resulting device structures. One illustrative method disclosed includes, among other things, forming a semiconductor structure above a doped well region defined in a semiconductor substrate, the semiconductor structure having a long axis that is oriented approximately vertical to an upper surface of the substrate, the semiconductor structure comprising a lower source/drain region and an upper source/drain region, at least a portion of which is positioned vertically above the lower source/drain region, wherein the lower source/drain region physically contacts the upper surface of the substrate, forming a counter-doped isolation region in the substrate, wherein the counter-doped isolation region is doped opposite to the doped well region, forming a metal silicide region in the substrate above the counter-doped region, wherein the metal silicide region is in physical contact with the lower source/drain region, and forming a lower source/drain contact structure that is conductively coupled to the metal silicide region.

One illustrative device disclosed herein includes, among other things, a semiconductor substrate comprising a doped well region defined in the semiconductor substrate, a semiconductor structure positioned above the doped well region, the semiconductor structure having a long axis that is oriented approximately vertical to an upper surface of the substrate, wherein the semiconductor structure comprises a lower source/drain region and an upper source/drain region, at least a portion of the upper source/drain region being positioned vertically above the lower source/drain region, wherein the lower source/drain region physically contacts the upper surface of the substrate, a counter-doped isolation region in the substrate that is doped opposite to the doped well region, a metal silicide region located above the counter-doped region, wherein the metal silicide region is in physical contact with the lower source/drain region, and a lower source/drain contact structure that is conductively coupled to the metal silicide region.

BRIEF DESCRIPTION OF THE DRAWINGS

The disclosure may be understood by reference to the following description taken in conjunction with the accompanying drawings, in which like reference numerals identify like elements, and in which:

FIGS. 2A-2M depict various novel methods disclosed herein for forming a contact structure for a vertical channel semiconductor device and the resulting device structures.

Figure 1:
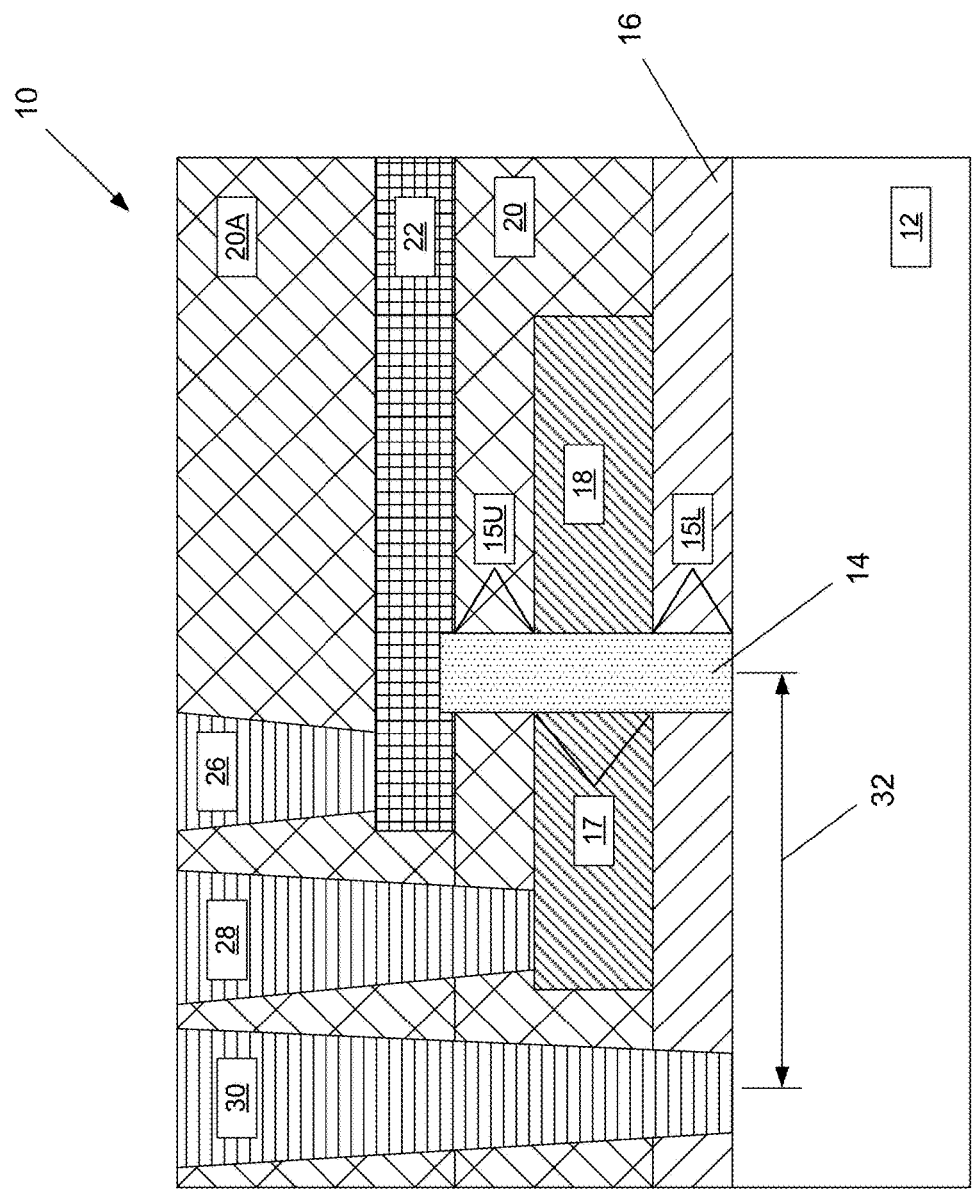
FIG. 1 is a simplistic depiction of an illustrative prior art vertical channel semiconductor device.

While the subject matter disclosed herein is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION

Various illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present subject matter will now be described with reference to the attached figures. Various structures, systems and devices are schematically depicted in the drawings for purposes of explanation only and so as to not obscure the present disclosure with details that are well known to those skilled in the art. Nevertheless, the attached drawings are included to describe and explain illustrative examples of the present disclosure. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase.

The present disclosure is directed to various methods of forming a contact structure for a vertical channel semiconductor device and the resulting device structures. The methods and devices disclosed herein may be employed in manufacturing products using a variety of technologies, e.g., NMOS, PMOS, CMOS, etc., and they may be employed in manufacturing a variety of different integrated circuit products, e.g., memory products, logic products, ASICs, etc. Of course, the inventions disclosed herein should not be considered to be limited to the illustrative examples depicted and described herein. With reference to the attached figures, various illustrative embodiments of the methods and devices disclosed herein will now be described in more detail. The various layers of material described below may be formed by any of a variety of different known techniques, e.g., a chemical vapor deposition (CVD) process, an atomic layer deposition (ALD) process, a thermal growth process, spin-coating techniques, etc. Moreover, as used herein and in the attached claims, the word "adjacent" is to be given a broad interpretation and should be interpreted to cover situations where one feature actually contacts another feature or is in close proximity to that other feature.

FIGS. 2A-2M depict various novel methods of forming a contact structure for a vertical channel semiconductor device and the resulting device structures. The illustrative device 100 will be formed above a semiconductor substrate 102. The device 100 may be either an NMOS transistor or a PMOS transistor. Additionally, various doped regions, e.g., the upper and lower source/drain regions, halo implant regions, well regions and the like, are not depicted in the attached drawings. The substrate 102 may have a variety of configurations, such as the depicted bulk silicon configuration. The substrate 102 may also have a silicon-on-insulator (SOI) configuration that includes a bulk silicon layer, a buried insulation layer and an active layer, wherein semiconductor devices are formed in and above the active layer. The substrate 102 may be made of silicon or it may be made of semiconductor materials other than silicon. Thus, the terms "substrate" or "semiconductor substrate" should be understood to cover all semiconducting materials and all forms of such materials.

Figure 2A:
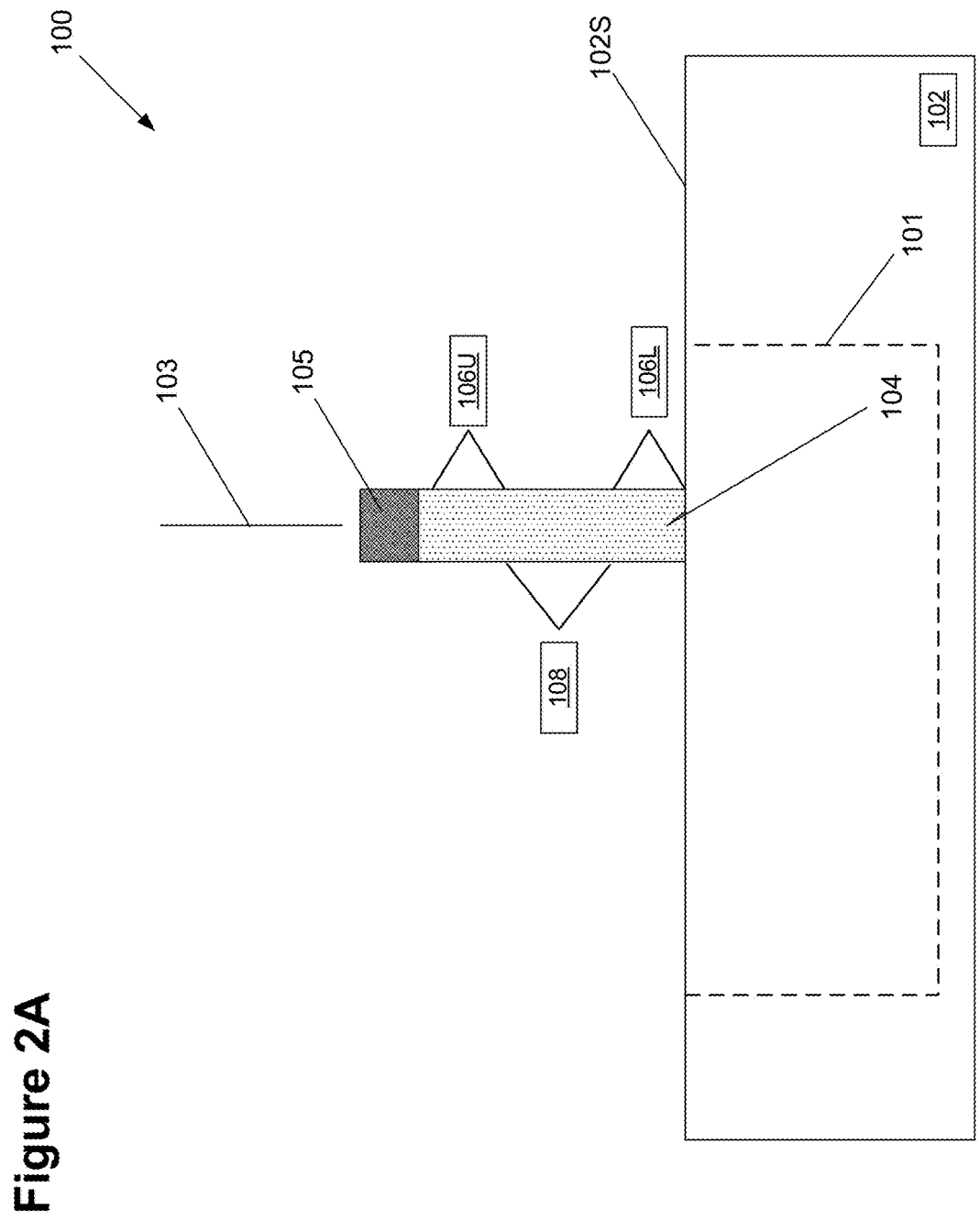

FIG. 2A depicts the device 100 at a point in fabrication wherein a vertical semiconductor structure 104 has been formed above the substrate 102. The long axis 103 of the semiconductor structure 104 is oriented in a direction that is substantially perpendicular to the upper surface 102S of the substrate 102. As will be described more fully below, the vertical semiconductor structure 104 is comprised of a lower source/drain region 106L, an upper source/drain region 106U and a channel region 108. Each of the source/drain regions 106L, 106U may function as either a source region or a drain region for the device 100 depending upon how the device is wired. A well region 101 is defined in the substrate 102 using standard techniques. In the case where the device 100 is an NMOS device, the well region 101 will be a P-doped well region. In the case where the device 100 is a PMOS device, the well region 101 will be an N-doped well region. In one illustrative embodiment the well region 101 may have a dopant concentration of about $1\times10^{17}$-$1\times10^{19}$ ions/cm$^3$. Although only a single semiconductor structure 104 is depicted, a single device 100 may comprise multiple numbers of such semiconductor structures 104. The physical configuration of the semiconductor structure 104 shown in FIG. 2A, e.g., the vertical and lateral dimensions of the semiconductor structure 104, may vary depending upon the particular application. When viewed from above (a plan view), the semiconductor structure 104 may have any type of configuration, e.g., substantially circular (i.e., a nanowire device), substantially rectangular, substantially square, etc. In the depicted example, the semiconductor structure 104 has a substantially uniform lateral width throughout its entire vertical height. In practice, the semiconductor structure 104 need not be so uniform, e.g., the lateral width of the semiconductor structure 104 at its bottom wherein it contacts the surface 102S of the substrate 102 may be greater than the lateral width of the semiconductor structure 104 at its uppermost surface.

The semiconductor structure 104 may be manufactured using a variety of techniques and by performing any of a variety of known epitaxial deposition processes. For example, the material of the semiconductor structure 104 may be deposited or grown on the substrate 102 and thereafter patterned by performing an etching process through the patterned masking layer 105 to define the semiconductor structure 104. Alternatively, a layer of insulating material (not shown) may be deposited on the surface of the substrate 102 and patterned to define openings in the layer of insulating material that expose the underlying substrate 102. The openings in the layer of insulating material correspond to the desired shape (when viewed from above) of the semiconductor structure 104 as well as the desired vertical and lateral dimensions of the semiconductor structure 104. Thereafter, the semiconductor material for the semiconductor structure 104 may be grown in the openings in the layer of insulating material. As will be appreciated by those skilled in the art after a complete reading of the present application, the presently disclosed inventions are not limited to the manner in which the semiconductor structure 104 is formed. The semiconductor structure 104 may be made of any type of semiconductor material, e.g., silicon, silicon-germanium ($Si_{(1-x)}Ge_{(x)}$), germanium, a III-V semiconductor material or compounds thereof (such as InGaAs, GaAs, InAs, GaSb, InSbAs, etc.). The doping of the lower source/drain region 106L and the upper source/drain region 106U as well as the channel region 108 of the semiconductor structure 104 may be accomplished by performing known ion implantation techniques or by performing in situ doping of the material of the semiconductor structure 104 as it is being formed.

Figure 2B:
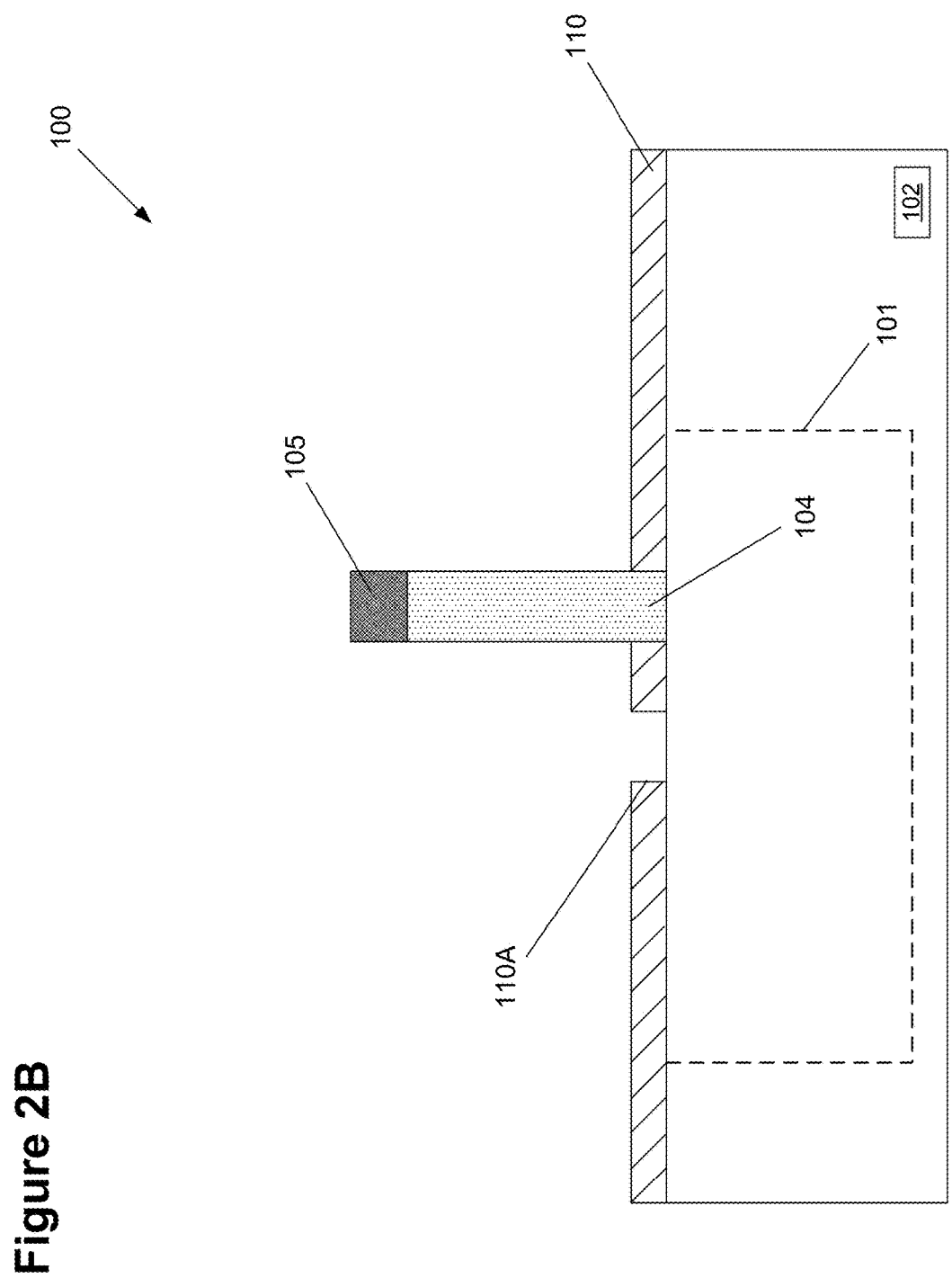

FIG. 2B depicts the device 100 after several process operations were performed. First, a layer of insulating material 110 (e.g., silicon nitride) was deposited above the substrate 102 and recessed to the desired thickness. Thereafter, an etching process was performed through a patterned etch mask (not shown), such as a patterned layer of photoresist material, to define an opening 110A in the layer of insulating material 110 so as to, in one embodiment, expose the surface of the substrate 102. The size of the opening 110A may vary depending upon the particular application. The configuration of the opening 110A when viewed from above may also vary depending upon the particular application, e.g., circular, square, rectangular, etc.

FIG. 2C depicts the device 100 after several process operations were performed. First, an ion implantation process 112 was performed through the opening 110A to introduce dopant material into the substrate 102. Thereafter, an anneal process, such as a rapid thermal anneal (RTA) process, was performed to activate and drive-in the implanted dopant materials. These process operations result in the formation of a counter-doped isolation region 112A in the substrate 102 within the well region 101. The counter-doped isolation region 112A has an inner perimeter 112X and an outer perimeter 112Y. Note that, in one embodiment (as depicted by the dashed line 113), the implant and anneal processes may be performed such that the inner perimeter 112X of the counter-doped isolation region 112A is positioned laterally under at least a portion of the semiconductor structure 104. In the depicted embodiment, the implant and anneal processes may be performed such that the inner perimeter 112X of the counter-doped isolation region 112A extends laterally beyond the semiconductor structure 104. That is, in the example depicted in FIG. 2C, when viewed from above, the semiconductor structure 104 is positioned above the area defined by the inner perimeter 112X of the counter-doped isolation region 112A. In all cases, when viewed from above, at least a portion (and sometimes all) of the semiconductor structure 104 will be positioned in the area defined by the outer perimeter 112Y of the counter-doped isolation structure 112A. The counter-doped isolation region 112A defines an isolation structure that will prevent or limit current flowing above the counter-doped isolation region 112A from flowing into the substrate 102. In the case where the substrate 102 is a P-type substrate and the well region 101 is an N-well region, the counter-doped isolation region 112A will comprise a P-type dopant, e.g., boron. In the case where the substrate 102 is an N-type substrate and the well region 101 is a P-well region, the counter-doped isolation region 112A will comprise an N-type dopant, e.g., arsenic. In one illustrative embodiment, the counter-doped isolation region 112A may have a dopant concentration of about $1 \times 10^{19}$-$1 \times 10^{21}$ ions/cm$^3$ (i.e., the counter-doped region 112A may typically have a dopant concentration that is about $10^2$ greater than that of the well 101). The ion implantation process 112 may be performed using a dopant dose that falls within the range of about $1 \times 10^{14}$-$1 \times 10^{15}$ ions/cm$^2$ at an energy level that falls within the range of about 2-15 keV. In one illustrative example, the RTA process may be performed at a temperature that falls within the range of about 900-1100° C. for a duration of about 0.1-5 seconds.

Figure 2D:
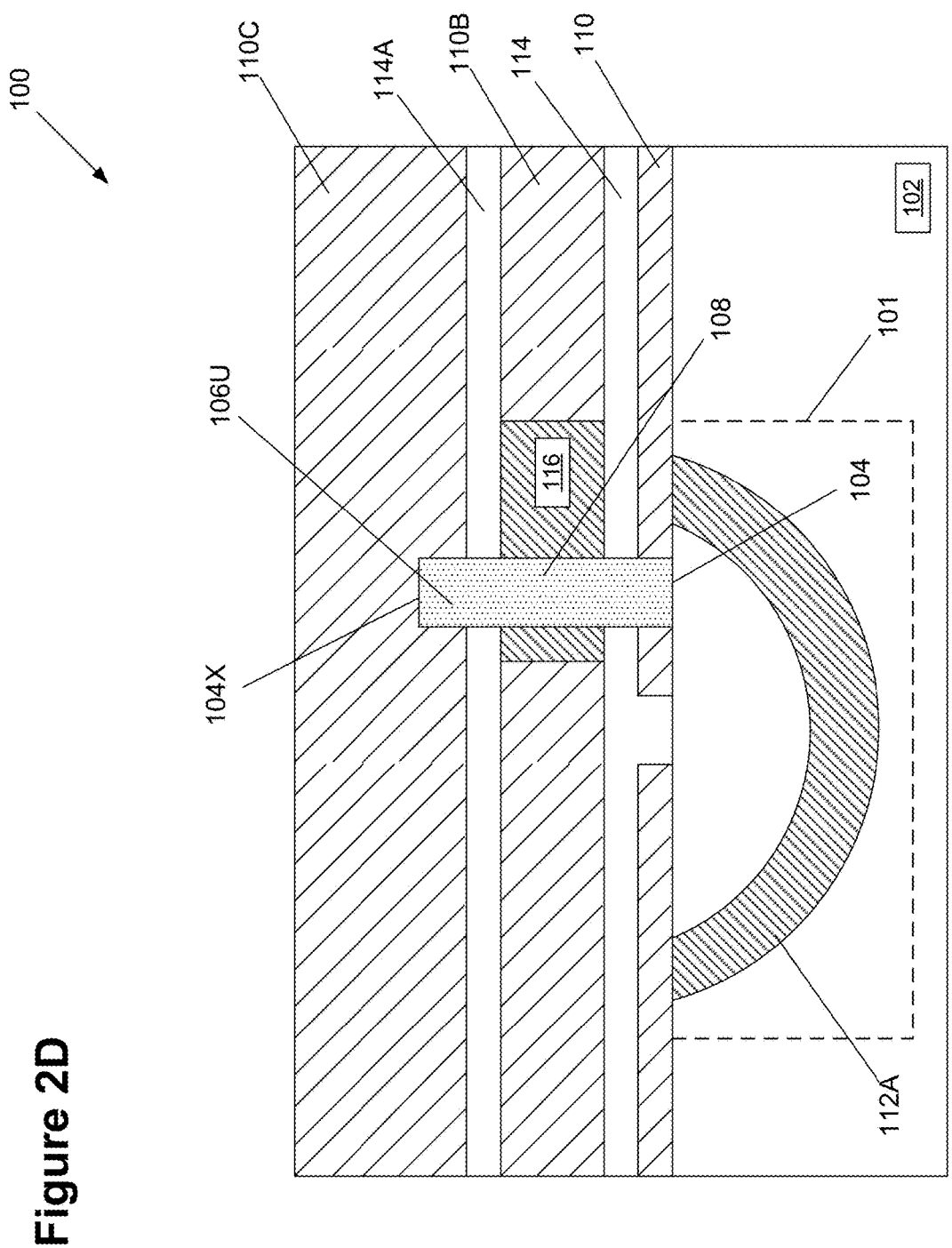

FIG. 2D depicts the device 100 after several process operations were performed. First, a layer of insulating material 114 (e.g., silicon dioxide) was formed above the layer of insulating material 110 and recessed to the desired thickness. In general, the layers of material 110, 114 should be made of different materials that may be selectively etched relative to one another. In the example described so far, the layer of insulating material 110 may be a layer of silicon nitride, while the layer of insulating material 114 may be a layer of silicon dioxide. However, the materials for these two layers may simply be reversed. Next, a simplistically depicted gate-all-around gate structure 116 was formed above the layer of insulating material 114 around the channel region 108 portion of the semiconductor structure 104. In one illustrative embodiment, the generic and representative gate structure 116 may constitute the final gate structure for the device 100 (manufactured using gate-first manufacturing techniques) or it may be the sacrificial gate structure for the device 100 which will be replaced with a replacement gate structure using replacement gate manufacturing techniques. The gate structure 116 may be generally comprised of a gate insulation material (not separately shown) positioned around the semiconductor structure 104 and one or more conductive material layers (not separately shown), such as one or more layers of metal or metal alloys, positioned around the gate insulation layer. In one particular embodiment, the gate insulation layer may comprise a high-k (k value greater than 10) material, such as hafnium oxide (or other high-k materials), or it may be made of silicon dioxide. The conductive materials of the gate structure 116 (which function as the gate electrode of the device 100) may comprise one or more conductive metal or metal alloy layers (e.g., titanium, titanium nitride) or polysilicon. The vertical thickness of the gate structure 116 may vary depending upon the particular application. In one embodiment, the material for the gate insulation layer is formed above the layer of insulating material 110 and the conductive gate electrode materials of the gate structure are formed above the gate insulation layer. Thereafter, one or more etching processes are performed through a patterned masking layer (not shown) to define the basic overall configuration of the gate structure 116. Note that the vertical thickness of the gate structure 116 corresponds to the channel length of the device 100. Also note that, since the gate structure 116 is oriented substantially horizontal relative to the surface of the substrate 102, the vertical thickness of the gate structure 116 (which corresponds approximately to the channel length of the device 100) can be much larger on this vertically oriented channel device than it would be on a horizontally oriented channel device. The overall horizontal orientation of the gate structure 116 of the present device 100 has many advantages relative to the substantial vertical orientation of a gate structure on a horizontally oriented channel device.

For example, the vertical thickness of the gate structure 116 does not, to any significant degree, adversely affect the packing density of the transistor devices on an integrated circuit product. Thus, the channel length of such vertically oriented devices 100 may be larger than that of a corresponding horizontally oriented device. As a result, so-called short channel effects may be reduced or eliminated when using vertically oriented devices 100 in designing integrated circuit products.

With continuing reference to FIG. 2D, the next step involves formation of the layer of insulation material 110B around the gate structure 116 and performing a recess etching process such that the layer of insulating material 110B has a desired thickness. In one embodiment, the layer of insulating materials 110, 110B are comprised of the same materials, e.g., silicon nitride. Next, a layer of insulating material 114A (e.g., silicon dioxide) was formed above the layer of insulating material 110B and recessed to the desired thickness. Typically, a portion of the upper source/drain region 106U extends above an upper surface of the layer of insulating material 114A. Next, another layer of insulating material 110C (e.g., silicon dioxide) was formed above the layer of insulating material 114A. The layer of insulating material 110C is formed to such a thickness that the upper end 104X of the semiconductor structure 104 is covered by the layer of insulating material 110C. As part of forming these various layers of material and performing various recess etching processes, the patterned mask layer 105 is removed from its position above the upper source/drain region 106U.

Figure 2E:
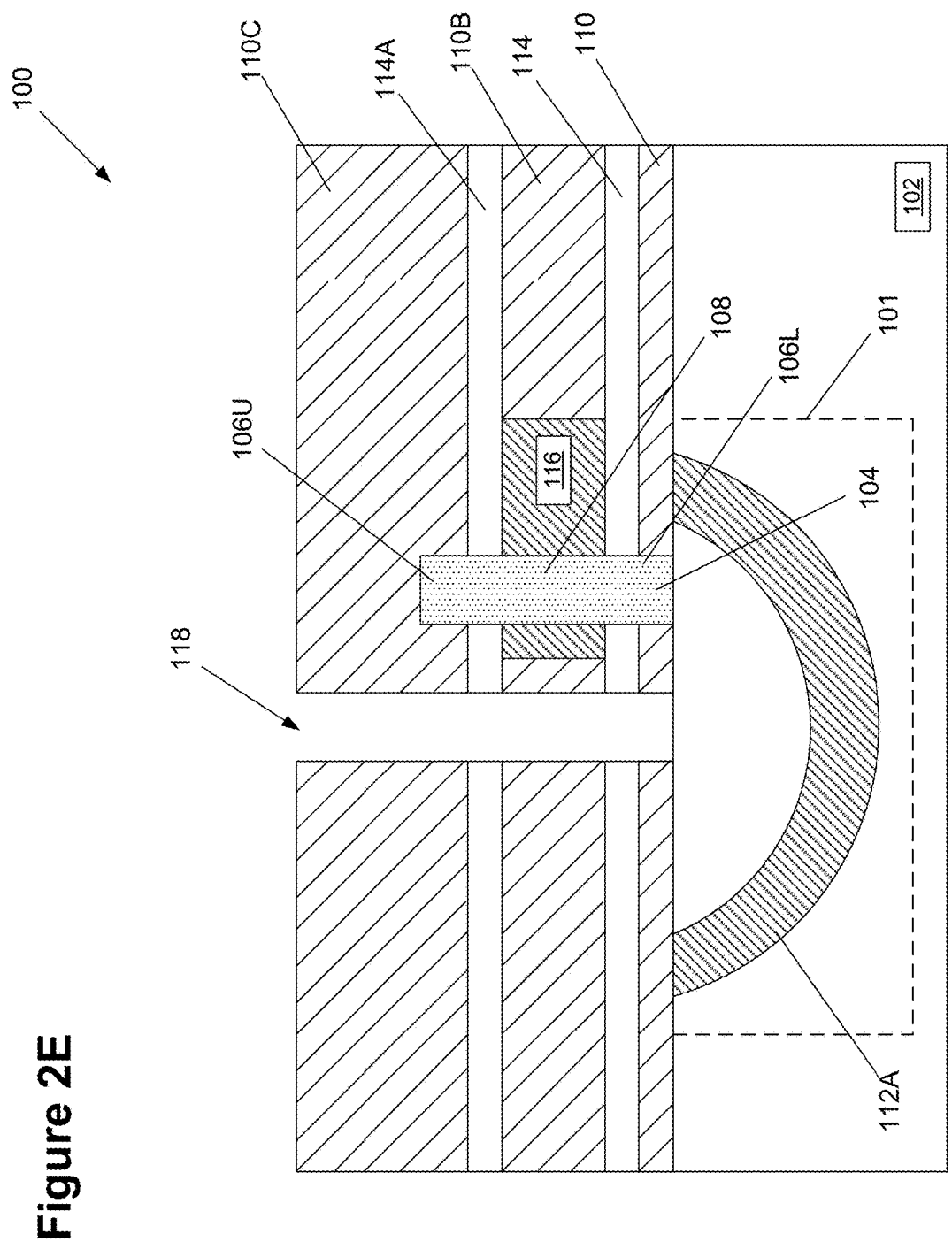

FIG. 2E depicts the device 100 after one or more etching processes were performed through a patterned etch mask (not shown), such as a patterned layer of photoresist material, to define an opening 118 in the layers of insulating material 110C, 114A, 110B, 114 and 110 so as to, in one embodiment, expose the surface of the substrate 102 within the area defined by the counter-doped isolation region 112A. The size of the opening 118 may vary depending upon the particular application. The configuration of the opening 118 when viewed from above may also vary depending upon the particular application, e.g., circular, square, rectangular, etc.

Figure 2F:
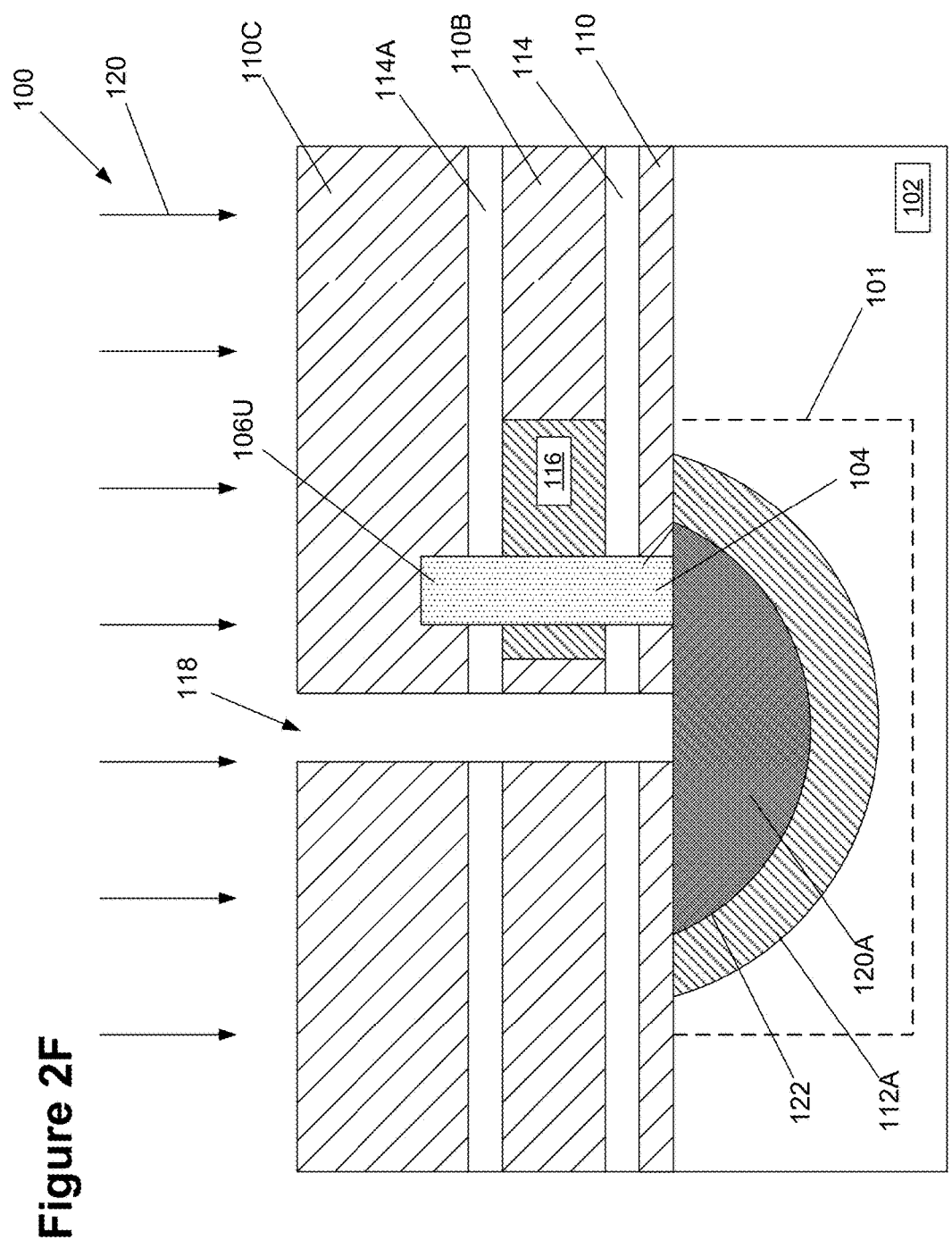

FIG. 2F depicts the device 100 after an amorphization ion implantation process 120 was performed through the opening 118 so as to define an amorphous region 120A (e.g., amorphous silicon) within the substrate 102 above at least a portion of the counter-doped isolation region 112A. At least a portion of the amorphous region 120A spreads under at least a portion of the semiconductor structure 104, and, in the depicted example, entirely under the semiconductor structure 104. The amorphous silicon region 120A spreads laterally due to lateral atom straggling. The formation of the amorphous region 120A results in the definition of an interface 122 between the amorphous silicon region 120A and the crystalline silicon substrate 102. In one illustrative embodiment, the amorphization ion implantation process 120 may be performed using a relatively large atom, such as xenon, argon, germanium, silicon, $GeF_2$, etc., or the like, so as to sufficiently damage the crystalline structure and order of the implanted area of the substrate 102. In one embodiment, the amorphization ion implantation process 120 may be performed using a dose that falls within the range of about $5 \times 10^{14}$-$5 \times 10^{15}$ ions/cm$^2$ at an energy level that falls within the range of about 1-10 keV. The purpose of performing this amorphization ion implantation process 120 is to form the amorphous silicon region 120A so that a relative low-temperature silicidation process may be performed to define a metal silicon contact as described more fully below.

The next process operation will involve formation of a metal silicide region that extends under the opening 118 and contacts the lower source/drain region 106L. Accordingly, FIG. 2G depicts the device 100 after a highly-conformal atomic layer deposition (ALD) process or an RF physical vapor deposition (PVD) process was performed to deposit a layer of refractory metal 124, e.g., nickel, platinum, cobalt, titanium, etc., or combinations thereof, having a thickness of, for example, 2-5 nm in the opening 118 such that it contacts the amorphous region 120A. In one particular embodiment, the layer of refractory metal 124 may comprise nickel.

Figure 2H:
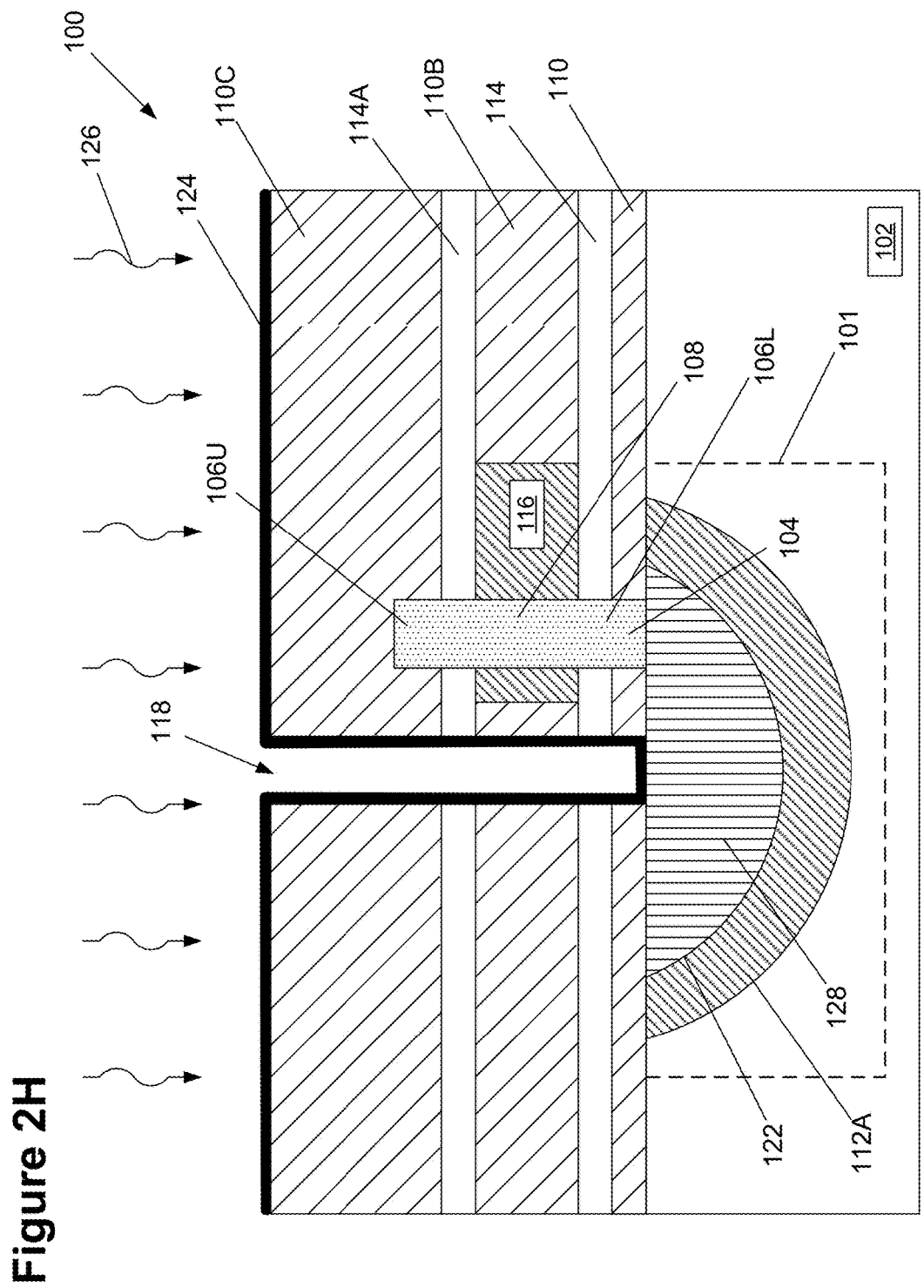
Figure 2I:
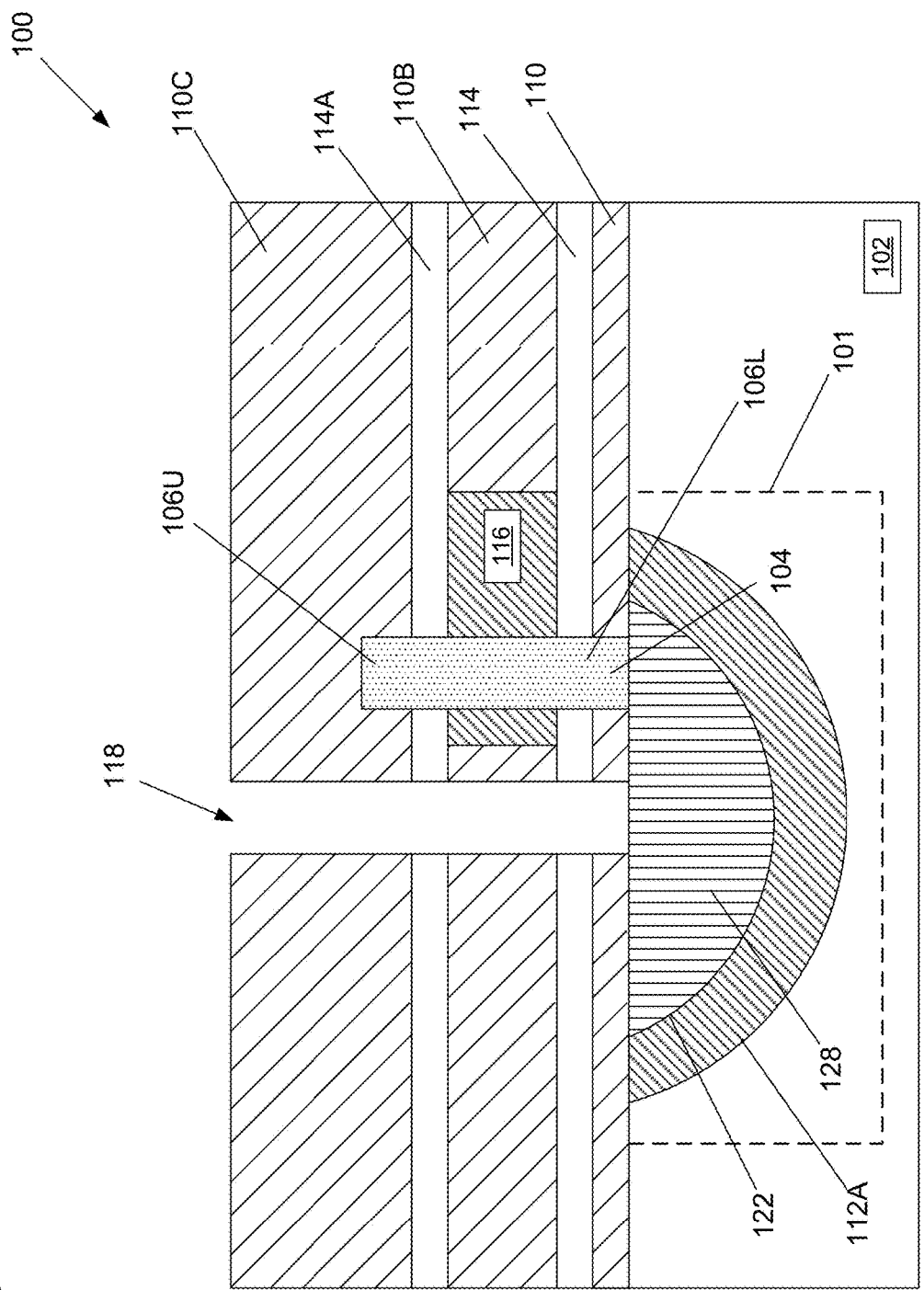

FIGS. 2H and 2I depict the device 100 after a low temperature anneal process 126 was performed to convert at least a portion of the amorphous region 120A to a metal silicide region 128, e.g., nickel silicide, that extends laterally far enough so as to conductively contact the lower source/drain region 106L. In one illustrative embodiment, the low temperature anneal process 126 may be performed at a temperature that falls within the range of about 350-600° C. for a duration of about 5-100 seconds. The low temperature anneal process 126 may be a single heating process or it may comprise two separate heating processes. In general, after an initial heating process is performed to cause the refractory metal to react with underlying amorphous region 120A, an etching process is performed to remove unreacted portions of the layer of refractory metal 124. In some applications, after the etching process is performed, a second low-temperature heating process may be performed to form the final phase of the metal silicide 128. The details of such silicidation processes are well known to those skilled in the art. FIG. 2I depicts the device 100 after the completion of the process operations that were performed to form the metal silicide region 128. Note that, in all embodiments disclosed herein, at least a portion of the metal silicide region 128 extends under and physically contacts the lower source/drain structure 106L in the semiconductor structure 104. In the depicted example, a portion of metal silicide region 128 is positioned entirely under the lower source/drain structure 106L and physically contacts the lower source/drain structure 106L.

Figure 2J:
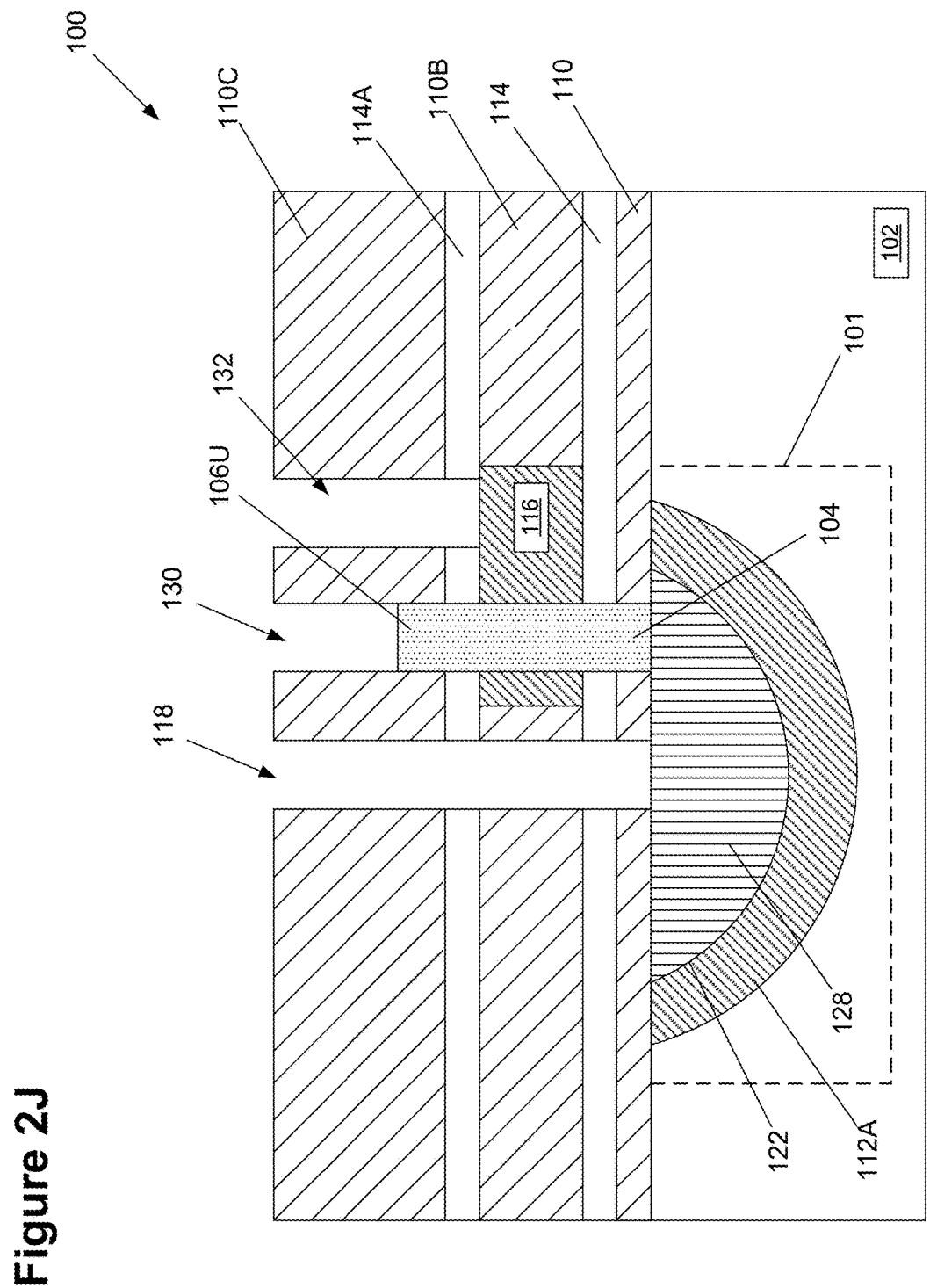

FIG. 2J depicts the device after one or more etching processes were performed through a patterned etch mask (not shown), such as a patterned layer of photoresist material, to define contact openings 130 and 132 in the depicted layers of insulation material. The opening 118 was filled with the masking material during the performance of the etching process to define the contact openings 130, 132. As depicted, the contact opening 130 exposes a portion of the upper source/drain region 106U, while the contact opening 132 exposes a portion of the conductive materials of the gate structure 116. The size and configuration of the openings 130, 132 may vary depending upon the particular application.

Figure 2K:
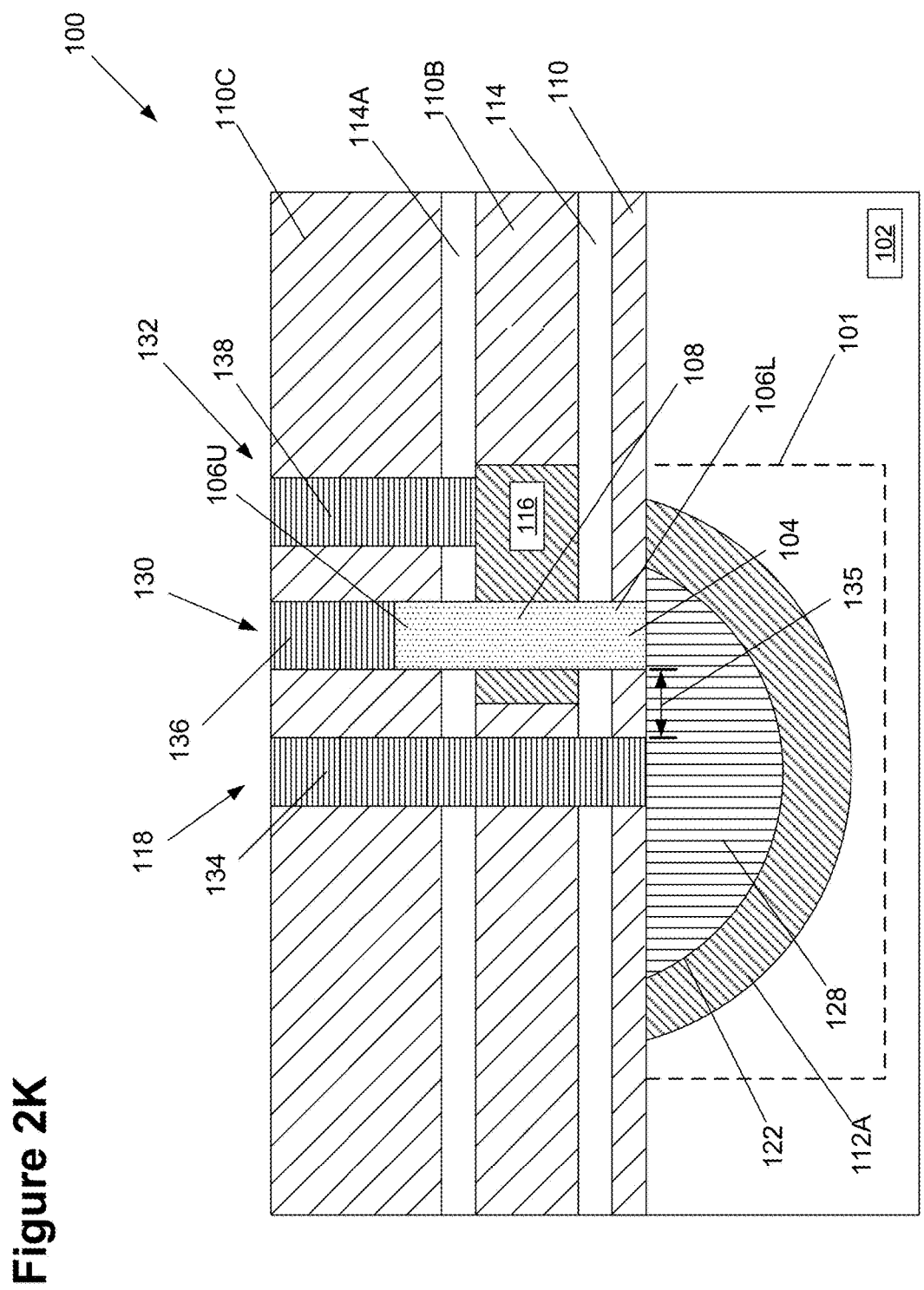

FIG. 2K depicts the device 100 after simplistically depicted lower source/drain conductive contact structure 134, upper source/drain conductive contact structure 136 and a gate conductive contact structure 138 were formed in the openings 118, 130 and 132, respectively. The conductive contact structures 136, 138 provide electrical connection to the upper source/drain region 106U and the gate structure 116, respectively. The combination of the conductive contact structure 134 and the metal silicide region 128 provide electrical connection to the lower source/drain region 106L. The conductive contact structures 134, 136 and 138 may also comprise one or more barrier layers (not shown). The configuration and structure of the conductive contact structures 134, 136 and 138 may vary depending upon the particular application. After the formation of the materials that make up the conductive contact structures 134, 136 and 138, a chemical mechanical polishing (CMP) process is performed to remove excess materials above the upper surface of the layer of insulating material 110C. The conductive contact structures 134, 136 and 138 may not all be positioned within the same plane as depicted in FIG. 2K. Note that, in one embodiment, the lateral spacing 135 between the lower source/drain contact structure 134 and the semiconductor structure 104 may be on the order of about 5-50 nm.

Figure 2L:
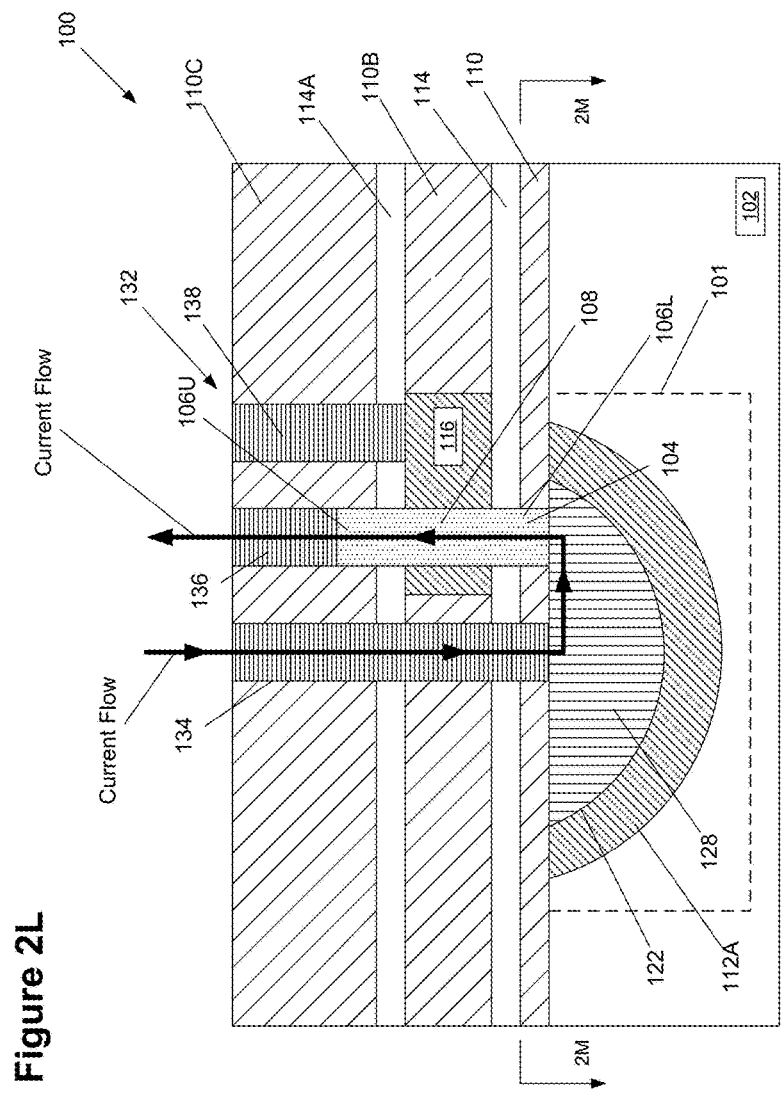

FIG. 2L depicts one illustrative example of the way current flows through the device 100 when it is turned "ON". Of course, the direction of current flow could be reversed by changing the wiring arrangement for the device 100.

Figure 2M:
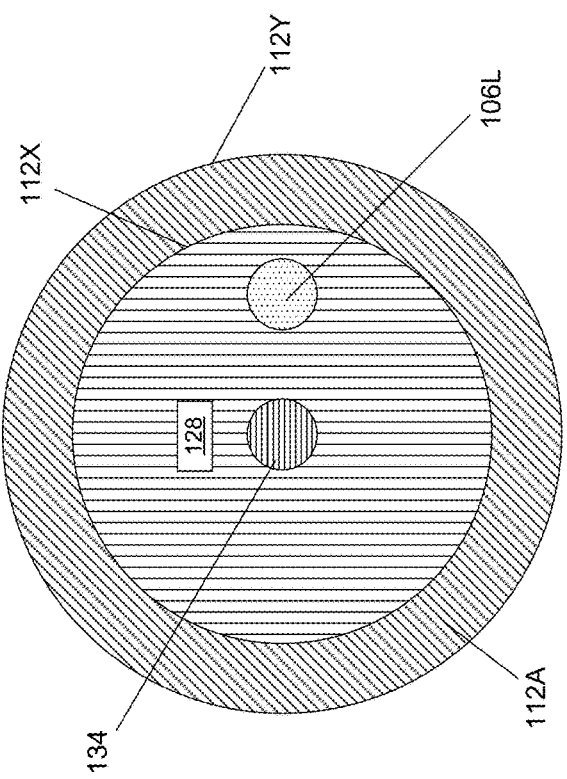

FIG. 2M is a plan view (taken where indicated in FIG. 2L with insulating material layer 110 omitted) showing the positional relationship of the counter-doped isolation region 112A, the metal silicide region 128, the conductive contact structure 134 and the lower source/drain region 106L in one illustrative embodiment of the device 100 disclosed herein wherein those structures and regions have a generally circular cross-sectional configuration when viewed from above.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Note that the use of terms, such as "first," "second," "third" or "fourth" to describe various processes or structures in this specification and in the attached claims is only used as a shorthand reference to such steps/structures and does not necessarily imply that such steps/structures are performed/formed in that ordered sequence. Of course, depending upon the exact claim language, an ordered sequence of such processes may or may not be required. Accordingly, the protection sought herein is as set forth in the claims below.

What is claimed:

1. A method of forming a vertically oriented transistor device, comprising:
    forming a semiconductor structure above a doped well region defined in a semiconductor substrate, said semiconductor structure having a long axis that is oriented approximately vertical to an upper surface of said substrate, said semiconductor structure comprising a lower source/drain region and an upper source/drain region, at least a portion of which is positioned vertically above said lower source/drain region, wherein said lower source/drain region physically contacts said upper surface of said substrate;
    forming a counter-doped isolation region in said substrate, wherein said counter-doped isolation region is doped opposite to said doped well region, and wherein said counter-doped isolation region separates and isolates an upper portion of said doped well region that is positioned above said counter-doped isolation region from a lower portion of said doped well region that is positioned below said counter-doped isolation region;
    forming a metal silicide region in said isolated upper portion of said doped well region above said counter-doped isolation region, wherein said metal silicide region is in physical contact with said lower source/drain region; and
    forming a lower source/drain contact structure that is conductively coupled to said metal silicide region.

2. The method of claim 1, further comprising, after forming said lower source/drain contact structure, forming an upper source/drain contact structure that is conductively coupled to said upper source/drain region.

3. The method of claim 1, wherein said counter-doped isolation region has an inner perimeter that surrounds and forms an interface with said isolated upper portion of said doped well region and wherein forming said metal silicide region comprises forming said metal silicide region within an area defined by said inner perimeter of said counter-doped isolation region.

4. The method of claim 1, wherein forming said metal silicide region comprises forming said metal silicide region such that it is in physical contact with an entire bottom surface of said lower source/drain region.

5. The method of claim 1, wherein forming said lower source/drain contact structure comprises forming said lower source/drain contact structure such that a lateral spacing between said lower source/drain contact structure and said lower source/drain region at an upper surface of said metal silicide region falls within a range of 5-50 nm.

6. The method of claim 1, wherein the method further comprises forming a gate structure all around a portion of said semiconductor structure between said lower source/drain region and said upper source/drain region.

7. The method of claim 6, further comprising, after forming said lower source/drain contact structure, performing at least one common process operation to form an upper source/drain contact structure that is conductively coupled to said upper source/drain region and a gate contact structure that is conductively coupled to said gate structure.

8. The method of claim 1, wherein forming said counter-doped isolation region comprises performing an ion implantation process through an opening in a patterned layer of insulating material to implant dopant atoms into said substrate and performing an anneal process to activate said implanted dopant atoms.

9. The method claim 1, wherein, after forming said counter-doped isolation region and prior to forming said metal silicide region, the method further comprises performing an amorphization implant process to define an amorphous region in said substrate that is positioned above said counter-doped isolation region.

10. The method claim 1, wherein said counter-doped isolation region has an inner perimeter that surrounds and forms an interface with said isolated upper portion of said doped well region and wherein, after forming said counter-doped isolation region and prior to forming said metal silicide region, the method further comprises performing an amorphization implant process to define an amorphous region in said substrate within an area defined by said inner perimeter of said counter-doped isolation region.

11. The method of claim 1, wherein forming said metal silicide region comprises depositing a layer of refractory metal on said substrate and performing an anneal process at a temperature that falls within a range of about 350-600° C. for a duration of about 5-100 seconds.

12. A method of forming a vertically oriented transistor device, comprising:

forming a semiconductor structure above a doped well region defined in a semiconductor substrate, said semiconductor structure having a long axis that is oriented approximately vertical to an upper surface of said substrate, said semiconductor structure comprising a lower source/drain region and an upper source/drain region, at least a portion of which is positioned vertically above said lower source/drain region, wherein said lower source/drain region physically contacts said upper surface of said substrate;

forming a counter-doped isolation region in said doped well region, wherein said counter-doped isolation region has an outer perimeter and is doped opposite to said doped well region, and wherein said counter-doped isolation region separates and isolates an upper portion of said doped well region that is positioned between said counter-doped isolation region and said upper surface of said substrate from a lower portion of said doped well region that is positioned outside of said outer perimeter;

performing an amorphization implant process to define an amorphous region within said isolated upper portion of said doped well region;

forming a metal silicide region in said amorphous region above said counter-doped isolation region, wherein said metal silicide region is in physical contact with said lower source/drain region; and forming a lower source/drain contact structure that is conductively coupled to said metal silicide region.

13. The method of claim 12, wherein said counter-doped isolation region has an inner perimeter that defines an outer boundary of said isolated upper portion of said doped well region and wherein forming said metal silicide region in said amorphous region comprises forming said metal silicide region within an area defined by said inner perimeter of said counter-doped isolation region.

14. The method of claim 12, wherein forming said metal silicide region comprises forming said metal silicide region such that it is in physical contact with an entire bottom surface of said lower source/drain region.

15. The method of claim 12, wherein forming said lower source/drain contact structure comprises forming said lower source/drain contact structure such that a lateral spacing between said lower source/drain contact structure and said lower source/drain region at an upper surface of said metal silicide region falls within a range of 5-50 nm.

16. The method of claim 12, wherein forming said metal silicide region comprises depositing a layer of refractory metal on said amorphous region and performing an anneal process at a temperature that falls within a range of about 350-600° C. for a duration of about 5-100 seconds.

17. A vertically oriented transistor device, comprising:
a semiconductor substrate comprising a doped well region defined in said semiconductor substrate
a semiconductor structure positioned above said doped well region, said semiconductor structure having a long axis that is oriented approximately vertical to an upper surface of said substrate, wherein said semiconductor structure comprises a lower source/drain region and an upper source/drain region, at least a portion of said upper source/drain region being positioned vertically above said lower source/drain region, wherein said lower source/drain region physically contacts said upper surface of said substrate;
a counter-doped isolation region positioned in and doped opposite to said doped well region, wherein said counter-doped isolation region separates and isolates an upper portion of said doped well region from a lower portion of said doped well region;
a metal silicide region located in said isolated upper portion of said doped well region above said counter-doped isolation region, wherein said metal silicide region is in physical contact with said lower source/drain region; and
a lower source/drain contact structure that is conductively coupled to said metal silicide region.

18. The device of claim 17, further comprising an upper source/drain contact structure that is conductively coupled to said upper source/drain region.

19. The device of claim 17, wherein said counter-doped isolation region has an inner perimeter and wherein said metal silicide region is positioned in said upper isolated portion of said doped well region within an area defined by said inner perimeter of said counter-doped isolation region.

20. The device of claim 17, wherein said metal silicide region is in physical contact with an entire bottom surface of said lower source/drain region.

21. The device of claim 17, wherein a lateral spacing between said lower source/drain contact structure and said lower source/drain region at an upper surface of said metal silicide region falls within a range of 5-50 nm.

22. The device of claim 17, further comprising a gate structure positioned all around a portion of said semiconductor structure between said lower source/drain region and said upper source/drain region.

23. The method of claim 1, wherein said counter-doped isolation region extends upward to said upper surface of said semiconductor substrate and completely surrounds said isolated upper portion of said doped well region.

* * * * *